United States Patent
Tajimi

(10) Patent No.: US 10,979,660 B2
(45) Date of Patent: Apr. 13, 2021

(54) IMAGING APPARATUS

(71) Applicant: CANON KABUSHIKI KAISHA, Tokyo (JP)

(72) Inventor: Go Tajimi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/519,696

(22) Filed: Jul. 23, 2019

(65) Prior Publication Data

US 2020/0036927 A1   Jan. 30, 2020

(30) Foreign Application Priority Data

Jul. 30, 2018   (JP) .............................. JP2018-142398

(51) Int. Cl.
*H04N 5/378* (2011.01)
*H04N 5/369* (2011.01)
*H01L 27/146* (2006.01)

(52) U.S. Cl.
CPC ....... *H04N 5/378* (2013.01); *H01L 27/14634* (2013.01); *H04N 5/379* (2018.08)

(58) Field of Classification Search
None
See application file for complete search history.

(56) References Cited

U.S. PATENT DOCUMENTS

| 8,320,685 | B2 | 11/2012 | Ozaki et al. |
| 2012/0268619 | A1* | 10/2012 | Uchida ................ H04N 5/365 348/222.1 |
| 2019/0289239 | A1* | 9/2019 | Gomi ................... H01L 27/146 |

FOREIGN PATENT DOCUMENTS

JP   2006238407 A   9/2006

* cited by examiner

*Primary Examiner* — Quan Pham
(74) *Attorney, Agent, or Firm* — Carter, Deluca & Farrell LLP

(57) ABSTRACT

An imaging apparatus includes a) an image sensor having a pixel unit with a plurality of pixels, a first memory unit, and a first rearrangement circuit; b) an information processing unit having a second memory unit, a second rearrangement circuit, and a control unit for simultaneously reading out a plurality of rows of image signals from the pixel unit, making the first rearrangement circuit rearrange image signals and then making the second rearrangement circuit rearrange image signals rearranged by the first rearrangement circuit to restore an order of the two-dimensional arrangement of the pixels in the pixel unit.

16 Claims, 16 Drawing Sheets

HORIZONTAL SYNC SIGNAL TIMING | FIRST H PERIOD | SECOND H PERIOD

A/D CONVERSION UNIT 114

FIRST MEMORY UNIT 112

FIRST I/F 102

SECOND MEMORY UNIT 122

OPERATION UNIT 127

TO BE OPERATED IN ADVANCE

IMAGING APPARATUS

BACKGROUND OF THE INVENTION

Field of the Invention

The present invention relates to an imaging apparatus, and particularly, to novel configurations and methods for rearranging image data read out from an image sensor.

Description of the Related Art

An imaging apparatus having an image sensor therein for converting an optical image into electrons and for realizing picking up a still image or a movie image is known. In such imaging apparatuses, according to recent progress in micro fine processing technology, a read-out rate of image data from the image sensor is improving. As a result, functions such as a moving image at a high frame rate, still image photography with a high resolution, and a high-speed continuous photography are being realized.

Especially, for increasing a read-out rate of information from image sensors, it is also known that high speed reading out is realized by simultaneously reading out plural lines of image data.

However, because of limitations of circuit structures of image sensors, it is not necessarily possible to read out image data from an image sensor in an original order corresponding to a physical layout of pixels. For example, there is a case where a readout circuit within a pixel is shared by a pair of pixels arranged next to each other in a column direction of a two-dimensional arrangement of pixels. In such case, if plural lines are simultaneously read out for high speed reading out, a pixel order or a pixel pitch of image signals read out from the image sensor may undesirably change.

Japanese Unexamined Patent Application, Publication No. 2006-238407 discloses a technique that rearranges data in a macro block unit for improving the efficiency of data encoding. However, while the above document discloses a data rearrangement technique for effective encoding, it does not take into account the problems mentioned above, such as changes of the pixel order or the pixel pitch caused in a high speed read out of image sensors. Therefore, the high speed read out of image sensors cannot be properly realized by the technique disclosed in the above document.

In addition, in general, image processing ICs include image correction circuits for high resolution, A/D convertors, and the like, which take up large areas in the ICs. Therefore, if a memory for the encoding mentioned in the above document is added, it causes a problem that the size of an image pickup apparatus increases. Accordingly, a breakthrough has been expected for improving high speed read out of image sensors without the increasing size.

SUMMARY OF THE INVENTION

One of the aspects of the present invention is to provide an imaging apparatus that can realize high speed read out together with appropriate downsizing.

The imaging apparatus according to one of features of the present invention includes, a) an image sensor including a pixel unit having a plurality of pixels arranged two-dimensionally, a first memory unit for storing at least a part of image signals output from the pixel unit; and a first rearrangement circuit for rearranging rows or columns of image signals using image signals stored in the first memory unit; and b) an information processing unit having a second memory unit for receiving at least a part of image signals rearranged by the first rearrangement circuit of the image sensor, a second rearrangement circuit for rearranging rows or columns of image signals using the image signals stored in the second memory unit and a control unit for simultaneously reading out a plurality of rows of image signals from the pixel unit, making the first rearrangement circuit rearrange image signals and then making the second rearrangement circuit rearrange image signals rearranged by the first rearrangement circuit to restore an order of the two-dimensional arrangement of the pixels in the pixel unit.

Further features of the present invention will become apparent from the following description of exemplary embodiments (with reference to the attached drawings).

DESCRIPTION OF THE EMBODIMENTS

Embodiments of the present invention will be described in detail below with reference to the accompanying drawings.

First Embodiment

Figure 1:
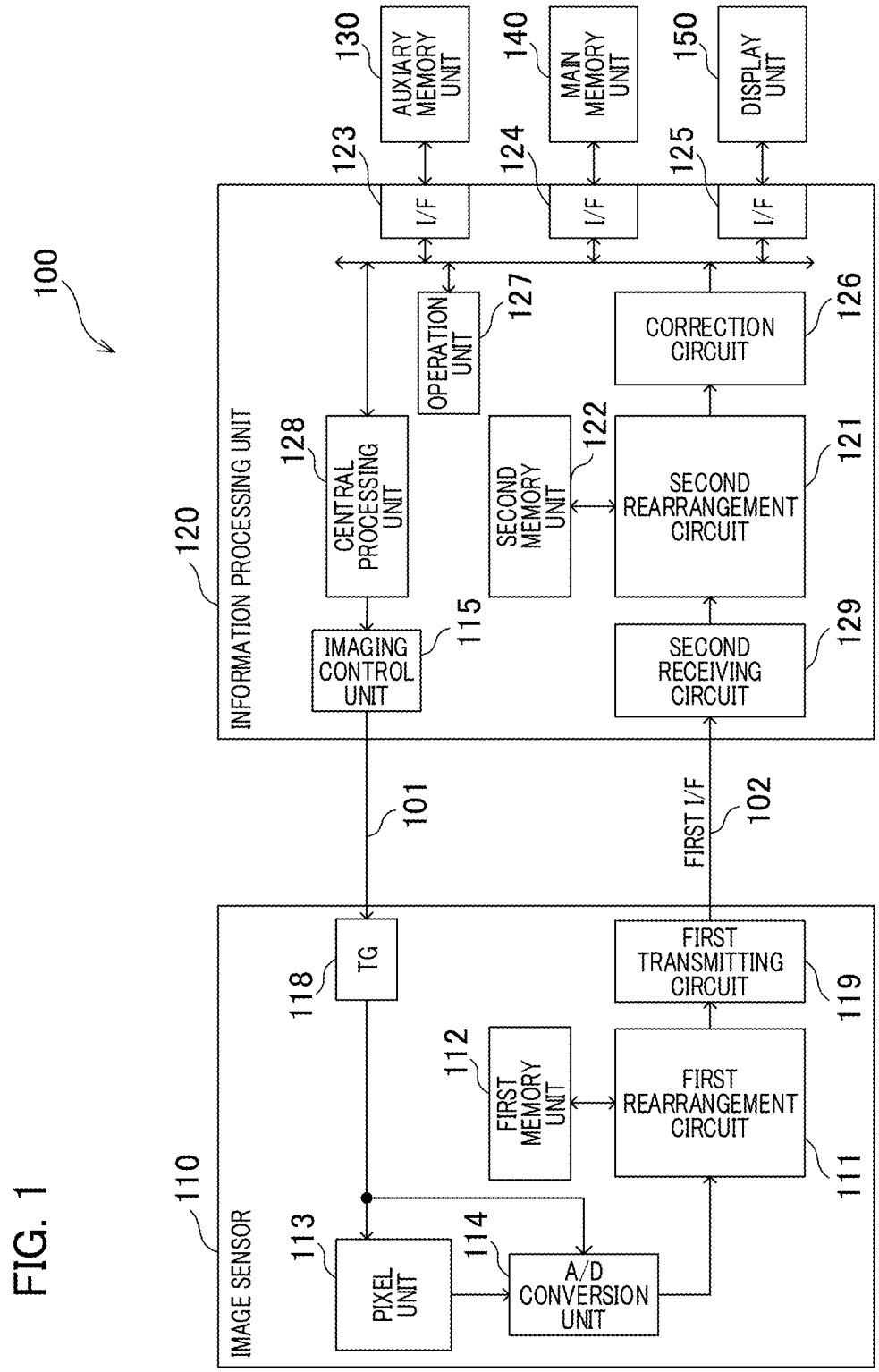
FIG. 1 is a schematic block diagram of an imaging apparatus 100 according to a first embodiment.

FIG. 1 is a schematic block diagram of an imaging apparatus 100 according to a first embodiment. The imaging apparatus 100 includes an image sensor 110, an information processing unit 120, an auxiliary memory unit 130, a main memory unit 140 and a display unit 150.

In this embodiment, the image sensor 110 is configured as a multilayer-type image sensor having a plurality of layered semiconductor substrates that are stacked to constitute one IC chip as a whole. Although the information processing unit 12 also constitutes another IC chip, some parts thereof may be separately included on a different IC chip.

A first I/F 102 is an interface for transferring image information (image signals/pixel signals) read out from the image sensor 110 to the image processing unit 120. The first I/F 102 may be a serial interface for transferring data in synchronism with clock signals or for transferring data including buried clock signals. Or, the first I/F 102 may be a parallel interface for transferring data by dividing image information into a plurality of parallel data lanes. By using the parallel interface, compared to a single data lane, it is possible to transfer image information at a higher rate with respect to time.

In this embodiment, the first I/F 102 assumes an interface that transfers data including buried clock signals.

101 denotes a drive control signal for controlling the image sensor 110 as a whole and includes horizontal synchronization (hereinafter H sync) signals for controlling timings and the like for reading out image information from the image sensor 110.

In this embodiment, each time an H sync signal included in the drive control signal 101 is input, either the number of rows such as one row, two rows, or twelve rows of image information can be simultaneously read out. In this connection, the drive control signal 101 includes an instruction signal for controlling the number of rows of image information to be simultaneously read out and a rearrangement control signal for controlling a rearrangement method carried out in a first rearrangement circuit, which is disclosed below.

The information processing unit 120 outputs the drive control signal 101 including the H sync signal so that it is possible to read out image information from the image sensor 110 in a proper synchronous timing.

Next, a method using the H sync signal is explained. Assume reading out image information having an FHD quality (2160 columns and 1080 rows) in 30 FPS (Frames Per Sec), if an interval of the H sync signal is 20 Ls and one row signal is read out per each H sync signal, it will take 20 μs×1080 rows=21.6 ms. Therefore, there is a blank period for 11.7 ms per one frame, since one frame period is 1/30 sec=33.3 ms. During that blank period, image information is not read out. By saving power during that period, the imaging apparatus can reduce power consumption.

Furthermore, if image information for twelve rows is simultaneously read out per each H sync signal, it will take 20 μs×1080 rows/12=1.8 ms per one frame. In this case, the imaging apparatus can reduce power consumption during 31.5 ms per one frame. In short, while simultaneously reading out many more rows, the imaging apparatus can reduce more power consumption. In addition, by simultaneously reading out many more rows, the read-out period will be reduced so that a distortion of picked up image will be reduced.

The main memory unit 140 is used as a temporary buffer while the image information obtained from the image sensor 110 is processed by the image processing unit 120. The main memory unit 140 is for example a volatile memory such as a DRAM (Dynamic Random-Access Memory), since a DRAM is quick at writing/reading although data therein is lost when power is turned off. Therefore, it is suitable for computation processing that needs frequent writing/reading. The auxiliary memory unit 130 assumes an auxiliary role for the main memory unit 140. For example, after the power of the imaging apparatus is turned off, the auxiliary memory unit 130 serves to retain data as a non-volatile memory.

In addition, the auxiliary memory unit 130 serves as a memory for storing image data after image information undergoes a development process. Furthermore, the auxiliary memory unit 130 serves as a memory for storing a computer program necessarily used by the information processing unit 120 for controlling the image sensor 110. The auxiliary memory unit 130 is not necessarily included in the imaging apparatus 100, and may be removable from the imaging apparatus 100. Such a removable auxiliary memory unit 130 may be, for example, a SD (Secure Digital) card conforming to the removable media standard. The SD card includes a NAND recording area and is able to read/write data with a host apparatus through an interface called SDIO.

By using such removable media, which is removable from the imaging apparatus 100, as the auxiliary memory unit 130, a user of the imaging apparatus can transfer image data in the auxiliary memory unit 130 to another information terminal or can share image data with other users.

The display unit 150 includes a display device for reproducing and displaying image data stored in the auxiliary memory unit 130 or the main memory unit 140. The display unit 150 includes, for example, a TFT liquid crystal device, by which users can see photographed images.

Next, a configuration of the information processing unit 120 is explained.

A central processing unit 128 serves as a computer for performing an operation necessary for controlling the image sensor 110, for instructing peripheral circuits or other apparatuses to operate, and for sending a variety of control signals to other circuits. In addition, the central processing unit 128 controls rearranging image signals with the first rearrangement circuit when simultaneously reading out plural rows of image signals from the pixel unit. Then, the central processing unit 128 controls other rearranging with the second rearrangement circuit so that an order of the two-dimensional arrangement of the pixels in the pixel unit is restored. For that purpose, the drive control signal 101 includes a signal for instructing the number of rows of image signals to be simultaneously read out and control signals for controlling the operation of the first memory and the first rearrangement circuit.

A first external I/F 123 is an interface for the auxiliary memory unit 130 and for performing data communication according to an instruction from the central processing unit 128. The first external I/F 123 is used when image data, which is developed and is temporarily stored in the main memory unit 140, is transferred to the auxiliary memory unit 130 to be stored, or when the computer programs are read out from the auxiliary memory unit 130.

A second external I/F 124 is an interface for the main memory unit 140 and for performing data communication according to an instruction from the central processing unit 128. The second external I/F 124 is used when image data temporarily stored in the main memory unit 140 is transferred to the auxiliary memory unit 130, or when image data corrected by a correction circuit 126, which is explained below, is written into the main memory unit 140.

A third external FF 125 is an interface for the display unit 150 and is used when image data stored in the main memory unit 140 or the auxiliary memory unit 130 is transferred to the display unit 150.

An operation unit 127 is a circuit that performs an operation for a development process, autofocusing, image recognition, and exposure correction, and the like. The operation unit 127 is also used when operating image data stored in the main memory unit 140 or the auxiliary memory unit 130 according to an instruction from the central processing unit 128.

The correction circuit 126 is for correcting image data. Since image information read out from the image sensor 110 sometimes includes fluctuations caused by temperature condition or individual differences of the image sensor 110, the correction circuit 126 is used to correct such fluctuation. A second rearrangement circuit 121 is for rearranging rows or columns of data. As explained below, there is a case in which image information read out from the image sensor 110 cannot be read out in the order of physical pixel arrangement when more than a predetermined number of rows are simultaneously read out and when there is a structural limitation on a read-out circuit. Therefore, in order to form a proper image viewable by users based on image information read out from the image sensor, the present embodiment rearranges the image information in advance.

Specifically, before storing image data in the main memory unit 140 or the auxiliary memory unit 130, according to an instruction from the central processing unit 128, the second rearrangement circuit 121 is used to rearrange image information to restore an order corresponding to the physical pixel arrangement.

A second memory unit 122 is a buffer memory for temporarily storing at least a part of the image information while performing rearranging by the second rearrangement circuit. The second memory unit 122 is constituted by, for example, a SRAM.

Although when reading out a plurality of rows of image information, it is necessary to secure large memory space for the second memory unit 122, because of a limitation on circuit size, the memory space of the second memory unit 122 should be limited. In addition, if a workload is too concentrated on the second memory unit 122, then this will cause the processing speed of the entire system to be bottlenecked. Accordingly, the present embodiment divides the workload for rearrangement to be allotted to the first rearrangement circuit and the second rearrangement circuit, and memory space for the rearrangement is also divided to the first memory unit 112 and the second memory unit 122. Therefore, workload for memory is also dispersed, and areas of IC chips as a whole can be optimized.

An imaging control unit 115 is for outputting the drive control signal 101 and for sending the H synchronizing signal. The imaging control unit 115 generates the drive control signal 101 to be output when an instruction from the central processing unit 128 is received. The imaging control unit 115 also sets a variety of parameters in corresponding circuits in the image sensor 110 for controlling operation of an entire image sensor 110, including a first transmitting circuit. Specifically, according to a control from the central processing unit 128, the imaging control unit 115 performs an exposure setting, operation setting of an A/D conversion unit 114 and setting parameters for controlling drive modes, and the like.

According to the above settings, it is possible to perform control for switching the number of rows to be simultaneously read out and a number of rows rearranged in the first rearrangement circuit 111, and the like in accordance with an operation of the imaging apparatus 100. In addition, according to a control from the central processing unit 128, the first rearrangement circuit 111 and the first memory unit 112 of the image sensor 110 are controlled so that controlling of rearrangement and switching of rearrangement method are realized.

The drive control signal 101 includes such control signals for controlling various circuits in the image sensor 110.

A second receiving circuit 129 receives image data transferred via the first I/F 102 and is used to convert the data transferred via the first I/F 102 to a proper form to be easily processed by the information processing unit 120.

In this embodiment, the second receiving circuit 129 restores the clock signal included in the received signal.

Next, the image sensor 110 is explained.

A TG (timing generator) 118 forms internal signals for controlling the pixel unit 113 and the A/D conversion unit 114. The imaging control unit 115 can control the drive timings of the pixel unit 113 and the A/D conversion unit 114 from the information processing unit 120 by the H sync signal, TG 118, and the like.

The pixel unit 113 includes a plurality of pixels arranged two-dimensionally. Each pixel has a photo-electric converter for conducting photo-electric conversion of an optical image passing through an optical system (not shown). Each pair of neighboring pixels share a part of the circuits included in the pixels. The part of the circuits shared by the pair is, for example, an output gate circuit for reading out signals or a floating diffusion region, etc. Although each pair of two neighboring pixels arranged in column direction share the part of the circuits included in the pixels in this embodiment, each pair of two neighboring pixels arranged in row direction may share a part of the circuits included in the pixels. Furthermore, more than two pixels may share a part of circuits included in the pixels.

The pixel unit 113 includes a vertical scan circuit (a row selection circuit) for scanning (selecting) rows of pixels in vertical direction in synchronism with timing signals received from the TG 118. An analog image signals read out from the pixel unit 113 is sequentially transferred to the A/D conversion unit 114. In this connection, the pixel unit 113 and the first rearrangement circuit 111 are respectively arranged in different layers of the multi-layer type image sensor 110. The A/D conversion unit 114 is a convertor for converting analog image signals received from the pixel unit 113 into digital image data, wherein the A/D conversion unit 114 is arranged in a different layer from a layer where the pixel unit 113 is arranged.

A first transmitting circuit 119 is a circuit for forming transmitting signals by embedding (including) CLK signals in image data and for transferring the transmitting signals to the information processing unit 120 via the first I/F 102.

A first memory unit 112 is a memory unit for temporarily storing image data read out from the pixel unit 113 via the A/D conversion unit 114 to realize data rearrangement in the first rearrangement circuit 111. The first memory unit 112 is constituted by for example a SRAM, and the like.

In this embodiment, the first memory unit 112 is arranged in a layer different from a layer where the first rearrangement circuit 111 is arranged, wherein both layers are parts of the multi-layer type image sensor 110, while the first memory unit 112 and the first rearrangement circuit 111 may be arranged in the same layer.

The first rearrangement circuit 111 is a rearrangement circuit for rearranging digital data received from the A/D conversion unit 114 using image signals stored in the first memory unit 112. If image data is rearranged using only the first rearrangement circuit 111 without using the second rearrangement circuit 121, the first rearrangement circuit 111 will need too large an area within the image sensor 110. In that case, some functions should be given up because circuits therefor cannot be installed in the image sensor. Or, workload concentrates on the first rearrangement circuit 111 so that processing speed will be bottlenecked.

Conversely, if image data is rearranged using only the second rearrangement circuit 121 without using the first rearrangement circuit 111, the second rearrangement circuit 121 will take up too large an area within the information processing unit 120. In that case, some functions should be given up because circuits for those functions cannot be installed in the information processing unit 120. Or, workload concentrates on the second rearrangement circuit 121 so that processing speed will be bottlenecked.

Therefore, in this embodiment, by installing the first rearrangement circuit 111 and the second rearrangement circuit 121, and by allotting workload to both of them, areas for circuits of the image sensor 110 and the information processing unit 120 can be optimized and processing speed of the system can be optimized. That is one of main features of this embodiment.

Although the first embodiment of the imaging apparatus 100 is configured as explained above referring to FIG. 1, the configuration is not limited to that shown in FIG. 1.

For example, the imaging apparatus 100 may additionally include a release button for instructing starting photographing. In that case, in response to a user's pressing of the release button, the central processing unit 128 can control the image sensor 110 to pick up an image for a predetermined period and then to read out image data for recording and so on.

In contrast, it may be possible to take a photograph in response to an instruction from external unit via, for example, a network.

Figure 2:
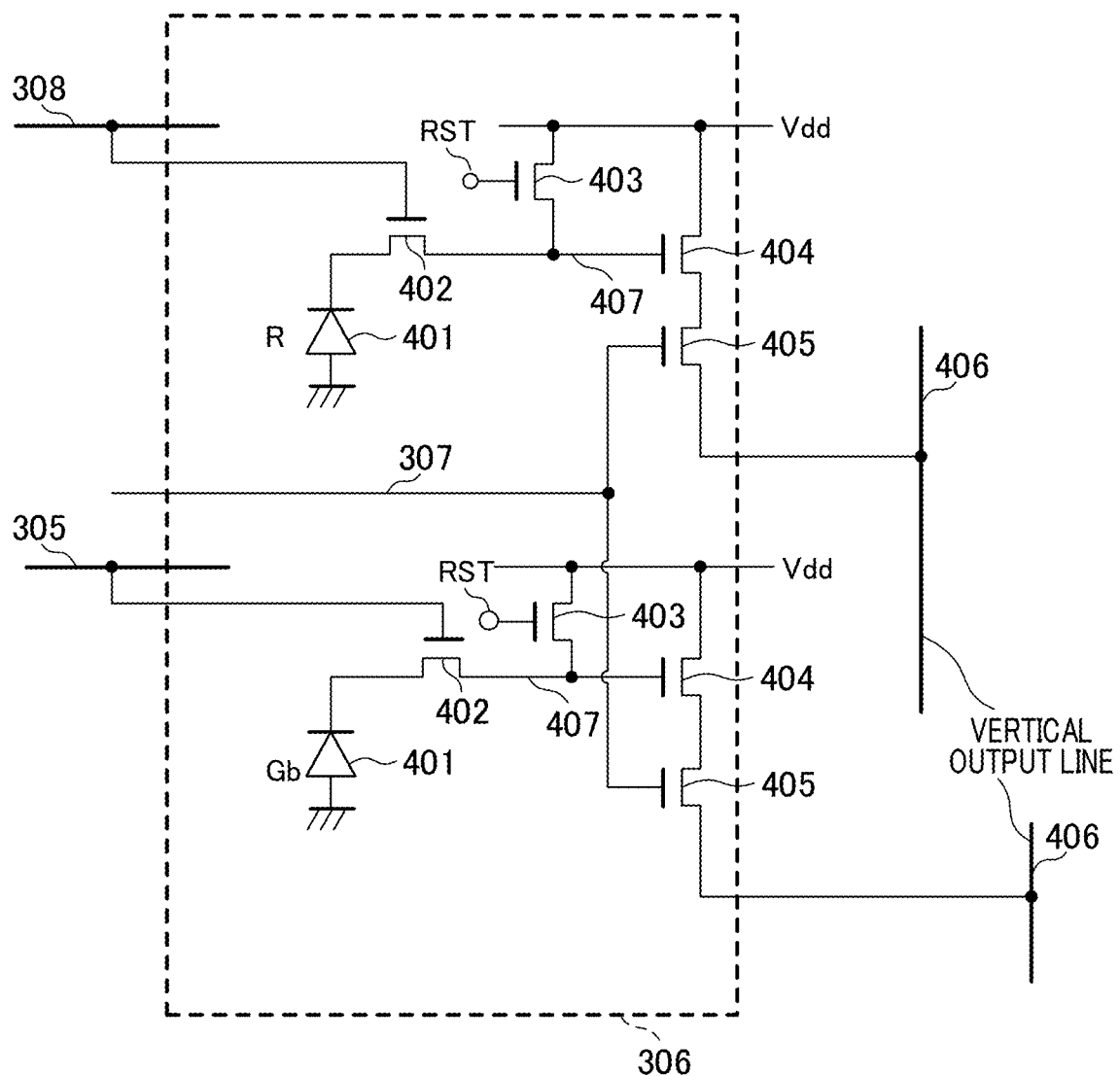
FIG. 2 is a schematic block diagram illustrating a pair of pixels included in a pixel unit 113 of an image sensor 110.
Figure 3:
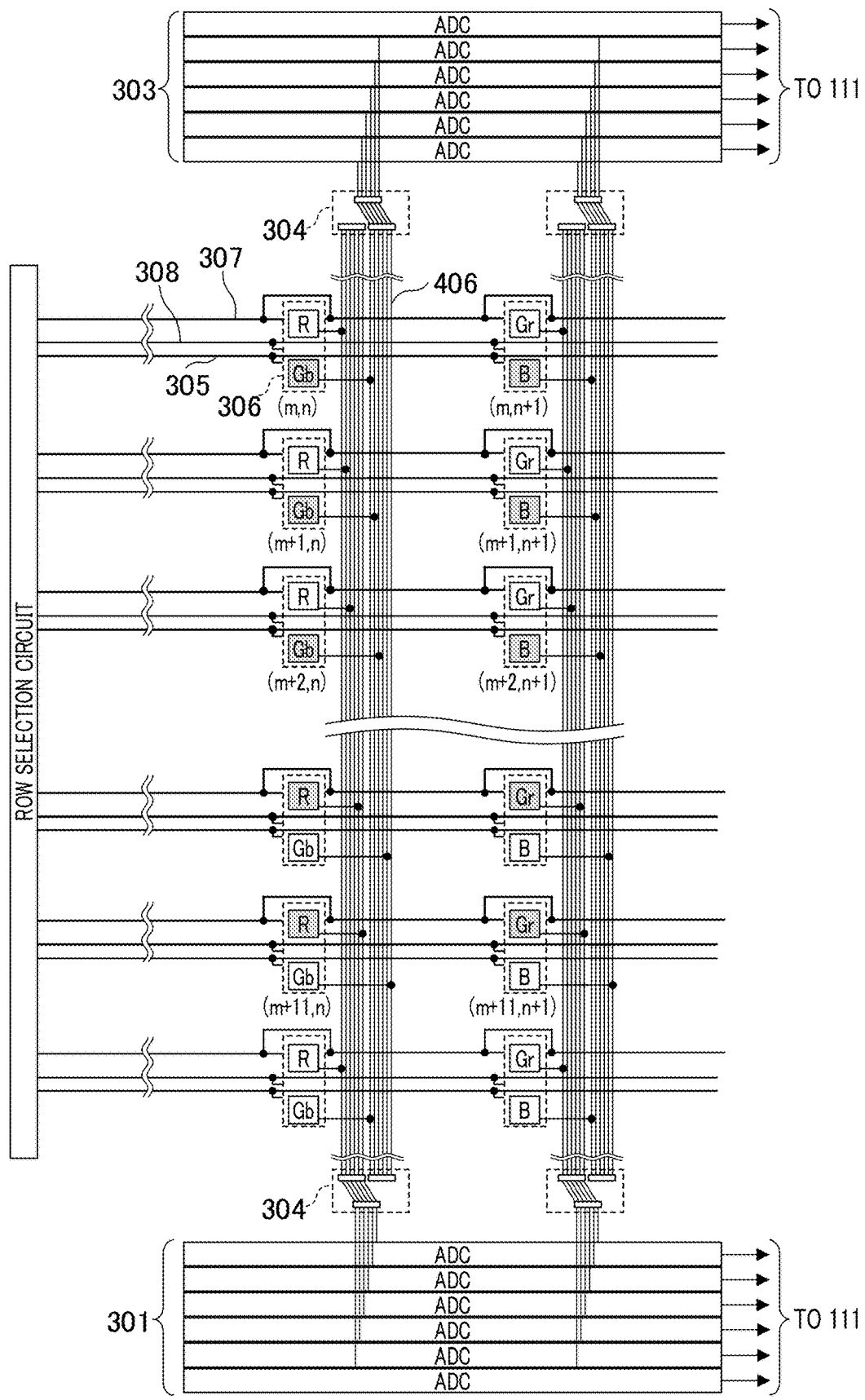
FIG. 3 is a schematic block diagram illustrating a pixel arrangement of the first embodiment.

Next, FIG. 2 shows a structure of a pair of pixels in the pixel unit 113 of the image sensor 110, and FIG. 3 shows an example of pixel arrangement in the pixel unit 113 according to the first embodiment.

In FIG. 2, 401 denotes a photodiode (PD hereinafter) constituting the photo-conversion unit that photo-converts light received from an object into a corresponding amount of electrical charge. A pixel pair 306 includes a pixel that has a PD 401 receiving Red color light passing through a Red filter and a pixel that has a PD 401 receiving Green color light passing through a Green filter (Gb). In each pixel, an anode of PD 401 is grounded and a cathode of PD is connected to a gate of an amplifying transistor 404 through a transfer transistor 402. A node connected to the gate of the amplifying transistor 404 constitutes a floating diffusion region (hereinafter FD region) 407. The transistors 402 to 405 are, for example, N channel MOSs (Metal Oxide Semiconductor).

A drain of a reset transistor 403 is connected to a pixel power line Vdd, and a source of the reset transistor 403 is connected to the FD region 407. By supplying a reset pulse RST to a gate of the reset transistor 403 through a reset signal line (not shown), the reset transistor 403 is turned on to reset the FD region 407.

After resetting the FD region 407, a transfer pulse is supplied via a first gate control line 308 (see also FIG. 3) to the transfer transistor 402 connected to the PD 401 receiving red light, so that the transfer transistor 402 is turned on and then charges photo-converted in the PD 401 receiving red light are transferred to the FD region 407.

A drain of a selection transistor 405 is connected to a source of the amplifying transistor 404, and a source of the selection transistor 405 is connected to a vertical output line 406. By supplying a selection pulse to a gate of the selection transistor 405 via a row selection line 307 (see also FIG. 3), which is also supplied to a selection transistor 405 of another pixel constituting the pair, those selection transistors 405 are turned on.

Thereby, the signal transferred to the FD region 407 is amplified by the amplifying transistor 404, and is subsequently transferred to the vertical output line 406 via the selection transistor 405.

Image signals formed in each pixel of the pixel pair are output via the respective vertical output line 406 to an ADC 303 and an ADC 301, and then respectively A/D converted. As shown in FIG. 3, the pixel unit 113 includes a lot of pixels arranged two-dimensionally, and each row selection line 307 is shared by gates of selection transistors 405 of each pair of pixels, which are next to each other in column direction.

In FIG. 3, (m, n) denotes a pixel pair 306 of a row number m and a column number n.

A first gate control line 308, a second gate selection line 305, and a row selection line 307 are wired to each row of pixel pair 306 from a row selection circuit 302. By supplying respective voltages to the first gate control line 308, the second gate selection line 305, and the row selection line 307, a predetermined pixel row in the pixel arrangement can be designated. Here, a pixel row is one of the rows consisting of R, Gr, R, Gr, and a row consisting of Gb, B, Gb, B.

There are four types of pixels, that is R (Red) pixel, B (Blue) pixel, Gr (Green 1) pixel and Gb (Green 2) pixel, which are alternately arranged to form a Bayer arrangement as shown in FIG. 3. R pixel and neighboring Gb pixel in column direction share a gate of the selection transistors 405, and Gr pixel and neighboring B pixel in column direction share a gate of selection transistors 405. By controlling the first gate control line 308 and the second gate selection line 305, one of the pixel rows is selectively read out to the vertical output line.

From each of the pixels arranged in the selected pixel row, a pixel signal (a photo-conversion signal) is read out through each of the vertical output line 406 in parallel. Then, those pixel signals are transferred to a first ADC (A/D convertor) 303 or a second ADC 301, which consist of the A/D conversion unit 114. The row selection circuit 302 is a circuit for designating at least one of the pixel rows from the pixel arrangement. In this embodiment, as a number of rows that can be simultaneously read out, one row, two rows, or twelve rows can be selected.

As mentioned above, by controlling the voltages of the row selection line 307, the first gate control line 308, and the second gate selection line 305 of the row selection circuit 302, a plurality of pixel rows in the pixel arrangement can be simultaneously designated so that a plurality of pixel rows can be simultaneously read out.

In FIG. 3, as an example, the row selection circuit 302 can simultaneously designate 12 rows (mth row to m+11th row) of the pixel pairs.

In that case, voltages of the row selection line 307 of designated 12 rows of pixel pairs are simultaneously switched by the row selection circuit 302. And, from those designated 12 rows of pixel pairs, upper pixel rows or lower pixel rows are further designated by the first gate control line 308 and the second gate selection line 305 so as to be simultaneously read out.

To cope with high speed read out, the first ADC 303 includes A/D converters for six rows and the second ADC 301 also includes A/D converters for six rows, which is a total of twelve A/D converters.

Additionally, in synchronism with pulses from the TG 118, twelve rows of image information at a maximum can be simultaneously read out to be simultaneously A/D converted.

An ADC switcher 304 is a switcher for simultaneously switching six vertical output lines out of twelve vertical output lines to either one of the first ADC 303 or the second ADC 301. Depending on a result of the switching, image signals are transferred to either one of the first ADC 303 or the second ADC 301.

Figure 4A:
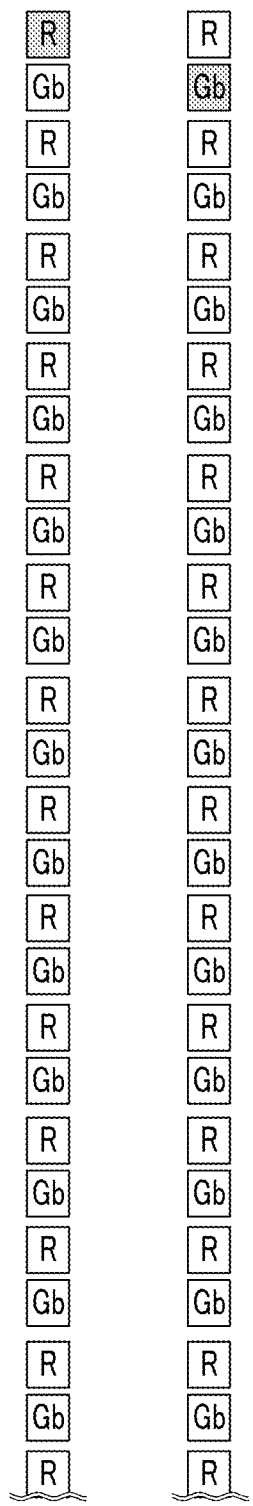
FIGS. 4A to 4C are diagrams illustrating exemplary sequences for reading out signals from the pixel units shown in FIG. 2 and FIG. 3.
Figure 4B:
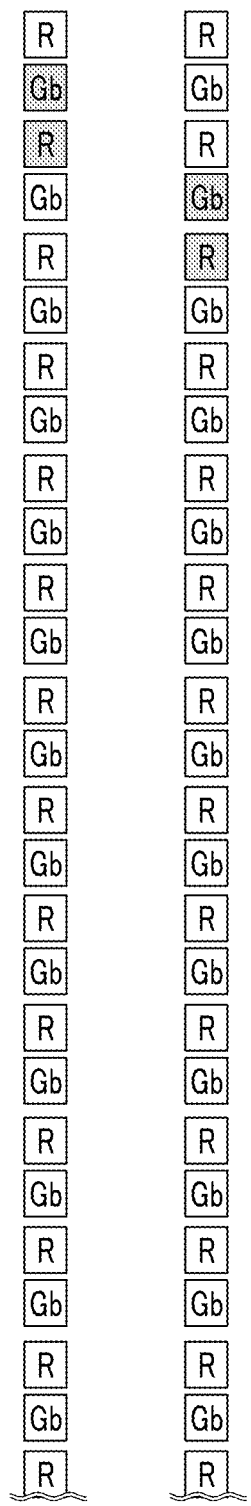
Figure 4C:
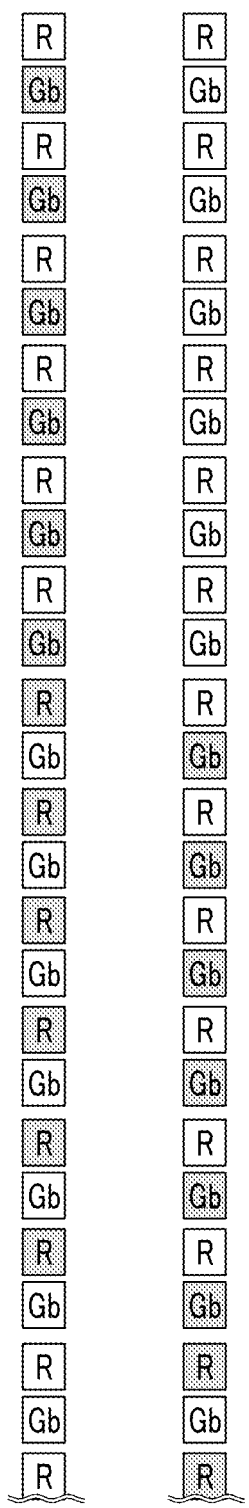

FIGS. 4A to 4C are diagrams for explaining reading methods for the pixel configurations shown in FIG. 2 and FIG. 3.

By changing the control method of the row selection circuit 302, it is possible to select a reading method for reading out pixel rows one row by one row as shown in gray in FIG. 4 (A). Alternatively, it is possible to select a reading method for simultaneously reading out pixel rows two rows by two rows, as shown in gray in FIG. 4 (B).

Furthermore, it is also possible to select a reading method for simultaneously reading out pixel rows twelve rows by twelve rows, as shown in gray in FIG. 4 (C).

In this embodiment, one of those three reading methods can be selected. When twelve rows by twelve rows are simultaneously read out, a read-out period can be shortened so that the speed of continuous photographing or a frame rate of a movie video image can be increased.

As shown in FIGS. 4(A) to 4(C), depending on Nth timing and N+1st timing of H sync signal, it is possible to realize alternate cyclic reading out in two different patterns. That is, in FIG. 4(A), in response to the Nth timing of H sync signals, a plurality of pixel signals of a first pixel row of every column, which is shown in gray, can be simultaneously read out to the vertical output lines.

Subsequently, the plurality of pixel signals of the first pixel row is A/D converted by the ADC row by row to be read out in one horizontal period. Then, in the N+1st timing of H sync signal, a plurality of pixel signals of a second pixel row is simultaneously read out to the vertical output lines. Next, the plurality of pixel signals of the second pixel row of every column is A/D converted by the ADC row by row to be read out in one horizontal period. Similarly, in response to N+2nd timing of H sync signal, the third pixel row of each column is simultaneously read out, and in response to N+3rd timing, the fourth pixel row of each column is simultaneously read out.

In FIG. 4 (B), in response to the Nth timing of H sync signal, a plurality of pixel signals of a second pixel row and a third pixel row of every column shown in gray is simultaneously read out to respective vertical output lines. Subsequently, the plurality of pixel signals of the second pixel row and the third pixel row is A/D converted by two ADCs row by row to be read out in one horizontal period. Next, in response to the N+1st timing of H sync signal, a plurality of pixel signals of a fourth pixel row and a fifth pixel row is simultaneously read out to the vertical output lines.

Subsequently the plurality of pixel signals of the fourth row and the fifth row of every column is A/D converted by two ADCs row by row to be read out in one horizontal period.

Similarly, in response to N+2nd timing of H sync signal, a sixth pixel row and a seventh pixel row of each column are simultaneously read out, and in response to N+3rd timing, an eighth pixel row and a ninth pixel row of each column are simultaneously read out.

In FIG. 4 (C), in response to the Nth timing of H sync signal, a plurality of pixel signals of 2, 4, 6, 8, 10 and 12th pixel rows and a plurality of pixel signals of 13, 15, 17, 19, 21 and 23rd pixel rows of every column shown in gray, are simultaneously read out to respective vertical output lines.

Next, the plurality of pixel signals of the twelve pixel rows is A/D converted by twelve ADCs row by row to be read out in one horizontal period. Then, in response to the N+1st timing of an H sync signal, a plurality of pixel signals of the 14, 16, 18, 20, 22 and 24th pixel rows and a plurality of pixel signals of the 25, 27, 29, 31, 33 and 35th pixel rows are simultaneously read out to the vertical output lines. Next, the plurality of pixel signals of the twelve pixel rows of every column is A/D converted by twelve ADCs row by row to be read out in one horizontal period.

Similarly, in response to N+2nd timing of H sync signal, the 26, 28, 30, 32, 34, 36, 37, 39, 41, 43, 45 and 47th row signals of every column are simultaneously read out. And, in response to N+3rd timing, the 38, 40, 42, 44, 46, 48, 49, 51, 53, 55, 57 and 59th row signals of every column are simultaneously read out.

Because of the structure of the pixel unit, when simultaneously reading out twelve rows, pixel signals of six odd numbered rows and subsequent six even numbered rows are simultaneously read out. Therefore, in this embodiment, rearranging pixel signals (image information) read out from the pixel unit 113 is carried out to obtain a proper still image or movie image for displaying, and the like.

Figure 5:
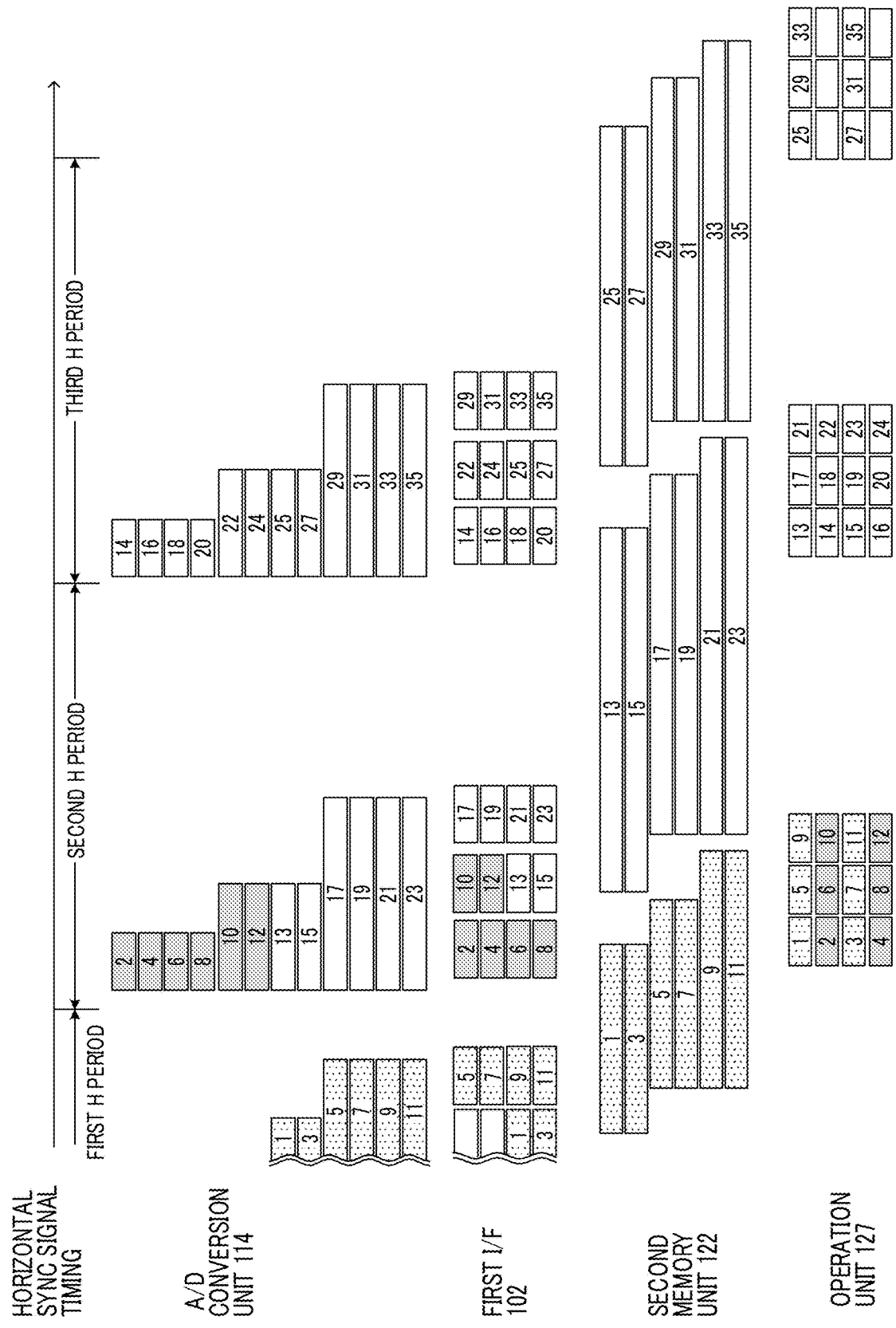
FIG. 5 is a timing chart illustrating an example of a rearrangement method of image signals.

FIG. 5 is a timing chart showing an example of rearrangement method for rearranging image information of twelve rows read out according to the reading out method shown in FIG. 4 (C).

In this embodiment, the second rearrangement circuit 121 is used for rearranging image information without using the first rearrangement circuit 111.

From the top of FIG. 5, an output timing of H sync signal is shown. Then, reading out timings of row signals from the image sensor 110 via the A/D conversion unit 114 in synchronism with the H sync signal, are shown.

In the middle of FIG. 5, transferring timings by the first I/F 102, then, row signals stored in the second memory unit are shown. And in the bottom part of FIG. 5, data rearranged by the operation unit 127 is shown.

To rearrange information by exclusively using the second rearrangement circuit 121 and the second memory unit 122, the 1, 3, 5, 7, 9 and 11th row signals (dotted in FIG. 5) are stored in the second memory unit 122 in one horizontal period. Specifically, in a first H period (horizontal period), the 1, 3, 5, 7, 9 and 11th row signals (dotted in FIG. 5) are read out from the pixel unit 113, A/D converted, transferred via the first I/F 102 and then stored in the second memory unit 122.

In a second H period, the 2, 4, 6, 8, 10 and 12th row signals together with 13, 15, 17, 19, 21 and 23rd row signals are simultaneously read out from the pixel unit 113, A/D converted, and transferred via the first I/F 102. And next, the 2, 4, 6, 8, 10 and 12th row signals are alternately combined with the 1, 3, 5, 7, 9 and 11th row signals stored in the second memory unit 122, so that rearrangement of the first to twelfth row signals for restoring original pixel arrangement such as shown in FIG. 3 is achieved.

The rearranged image information of the first to twelfth rows is then processed by the operation unit 127, transferred to the auxiliary memory unit 130 or the display unit 150.

Although the method explained in FIG. 5 can realize the rearrangement, the second memory unit 122 needs to store a large amount of data such as six rows of image data, and therefore, an area for the second memory unit 122 occupies large part of the image processing unit IC so that processing ability of the information processing unit IC will be limited.

Consequently, the area of the second memory unit 122 should be reduced as far as possible.

Figure 6:
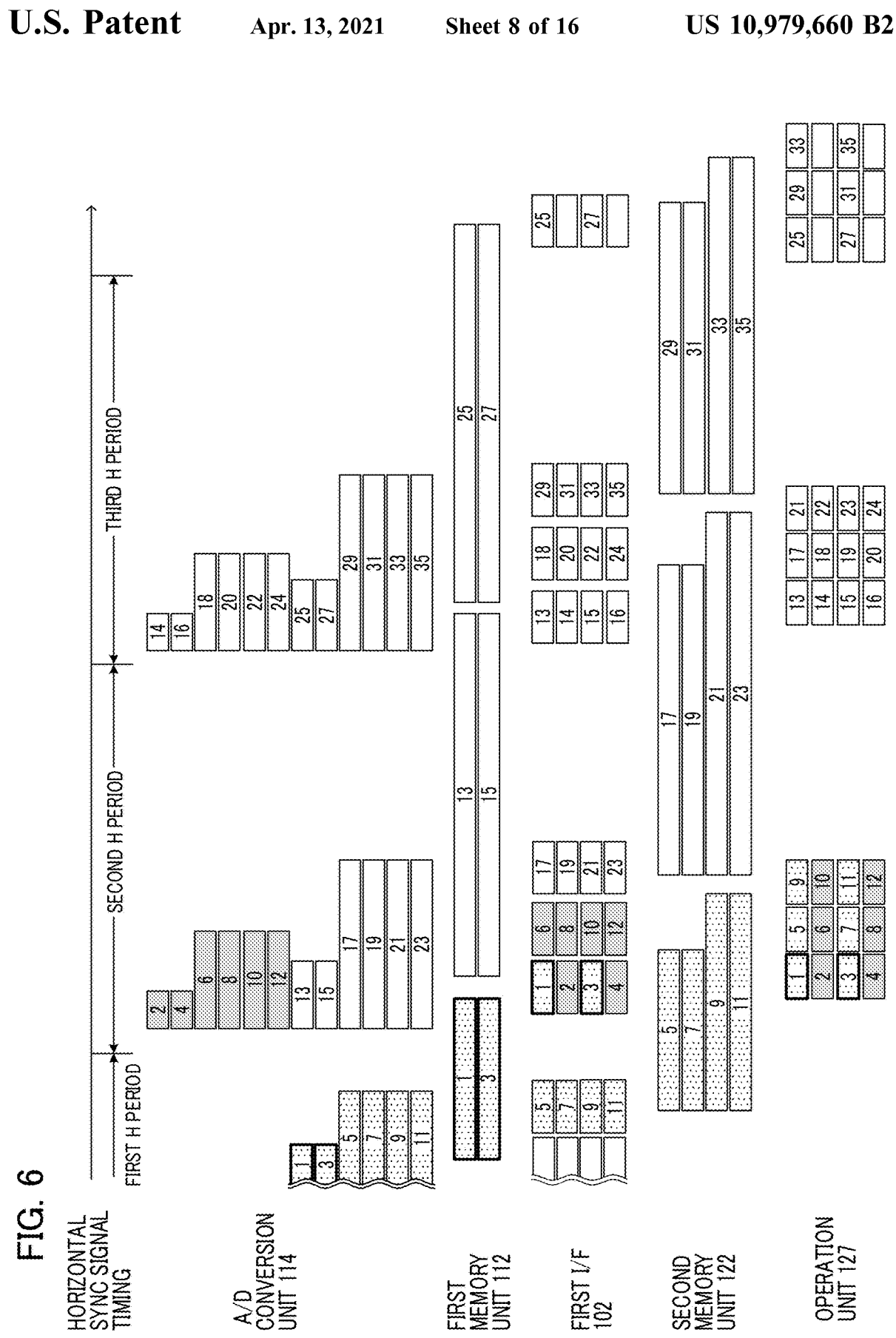
FIG. 6 is a timing chart illustrating a rearrangement method that allocates the first memory unit 112 and a second memory unit 122 according to the first embodiment.

Accordingly, in an embodiment shown in FIG. 6, not only the second rearrangement circuit 121 and the second memory unit 122, but the first rearrangement circuit 111 and the first memory unit 112 are used together to allot workload among them.

Consequently, memory area for rearrangement is properly allotted between the image sensor 110 and the information processing unit 120, so that area of the IC chips and the processing speed can be optimized.

FIG. 6 is a timing chart showing an example of a rearrangement method that allots a rearrangement process to the image sensor 110 and the information processing unit 120.

The following is the explanation of the rearrangement method shown in FIG. 6.

First, image information (image signal), which includes the 1, 3, 5, 7, 9 and 11th row signals, is read out from the pixel unit 113 in the first H period, A/D converted, and then stored in the first memory unit 112. At that time, the first row and the third row signals are stored in the first memory unit 112, wherein both are shown by a dotted pattern in bold frames.

The remaining 5, 7, 9 and 11th row signals read out at the same timing are A/D converted and transferred to the information processing unit 120 without being stored in the first memory unit 112.

The above 4 rows of image information transferred to the information processing unit 120 via the first I/F 102 is stored in the second memory unit 122.

Next, in the second H period, the 2, 4, 6, 8, 10 and 12th row signals of the pixel unit 113 together with the 13, 15, 17, 19, 21 and 23rd row signals are read out through the A/D conversion unit 114. At this time, the first row signal stored in the first memory unit 112 is read out first, then the second row signal is read out from the pixel unit 113 via the A/D conversion unit 114.

Next, the third row signal stored in the first memory unit 112 is read out, and then the fourth row signal is read out from the pixel unit 113 via the A/D conversion unit 114. By the above sequence, 1st to 4th row signals are rearranged to restore the original pixel arrangement (row order) in the pixel unit 113, and then transferred to the information processing unit 120 via the first I/F 102.

When the information processing unit 120 receives the above image information via the first I/F 102, four row signals (5, 7, 9 and 11th row signals) stored in the second memory unit 122 are read out alternately with row signals (6, 8, 10 and 12th row signals) read out from the A/D conversion unit 114.

By the above sequence, 5 to 12th row signals are rearranged to restore the original pixel arrangement (row order) in the pixel unit 113. Accordingly, four row signals (5, 7, 9 and 11th row signals) read out from the second memory unit 122 are alternately combined with the 6, 8, 10 and 12th row signals read out from the A/D conversion unit 114. As a result, 1st to 12th row signals are rearranged to restore the original pixel arrangement (row order) in the pixel unit 113.

According to the method shown in FIG. 6, compared to the method shown in FIG. 5, a total memory area for rearrangement is properly allotted to the first memory unit 112 and the second memory unit 122 respectively within a limitation of area of the image sensor 110 and the information processing unit 120. Therefore, respective areas of the IC chips can be optimized, downgrading of the specification of process ability can be avoided, the concentration of workload is reduced, and the total processing speed can be increased.

Second Embodiment

Figure 7:
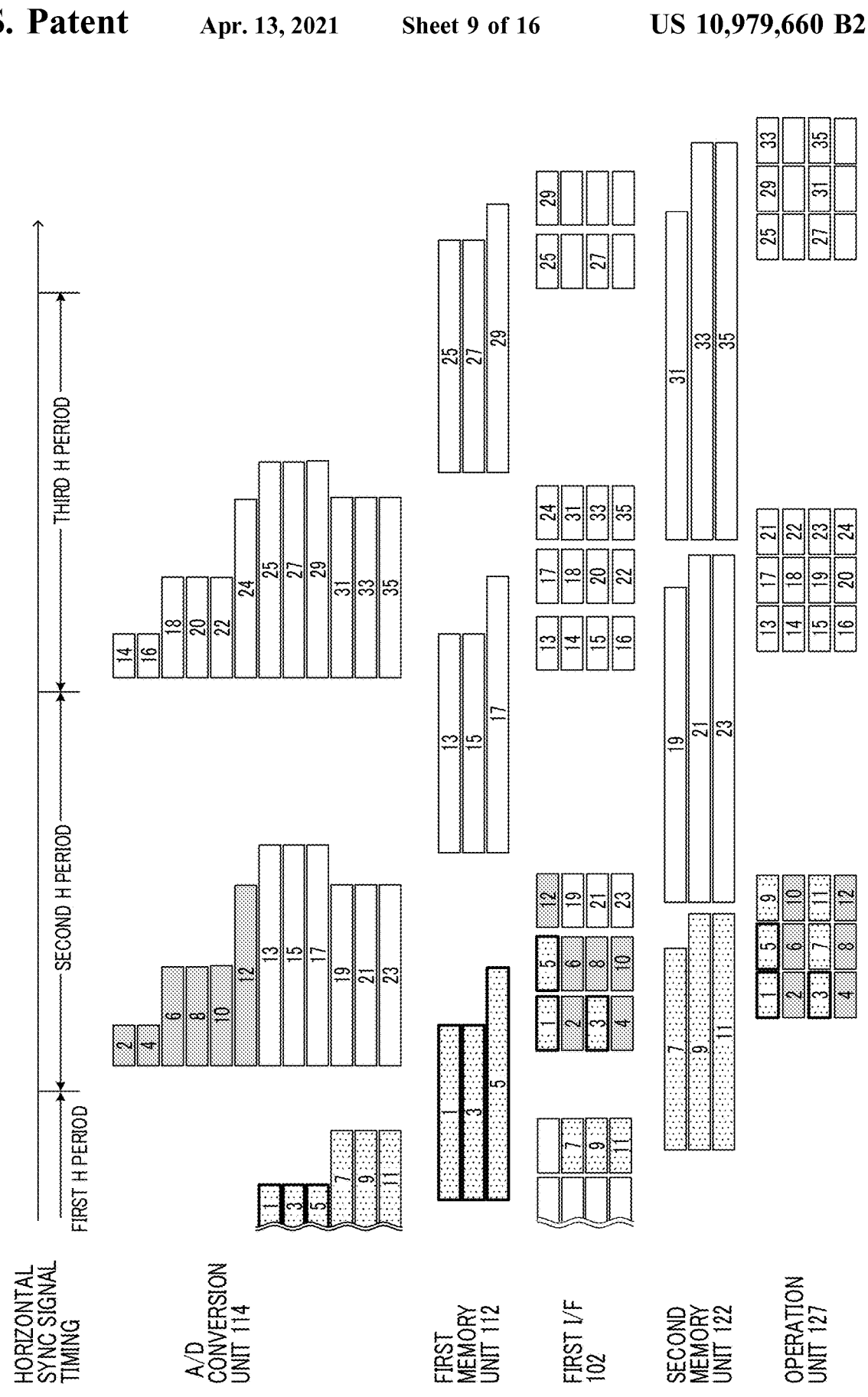
FIG. 7 is a timing chart illustrating another rearrangement method that allocates the first memory unit 112 and the second memory unit 122 according to the second embodiment.

Next, referring to FIG. 7, a rearrangement method according to the second embodiment is explained.

The rearrangement method shown in FIG. 7 is different from that shown in FIG. 6 in terms of a number of rows allotted to the first rearrangement circuit 111 and the second rearrangement circuit 121.

To be more specific, during the first H period, image information of the 1, 3 and 5th rows is stored in the first memory unit 112 and image information of the 7, 9 and 11th rows is to be stored in the second memory unit 122.

Generally, in rearranging X rows in total, when Y rows are rearranged in the image sensor 110, a memory area in the first memory unit 112 should correspond to Y rows, and a memory area in the second memory unit 122 should correspond to (X-Y) rows.

Therefore, the number of rows should not be limited to the first embodiment or the second embodiment. Depending on circuit sizes of the image sensor 110 and the information processing unit 120 and/or a limitation of chip area necessary for certain specifications, the respective number of rows for the rearrangement can be properly allocated. Accordingly, it is possible to design the image sensor 110 and the information processing unit 120 without degrading functions of circuits thereof.

Third Embodiment

Figure 8:
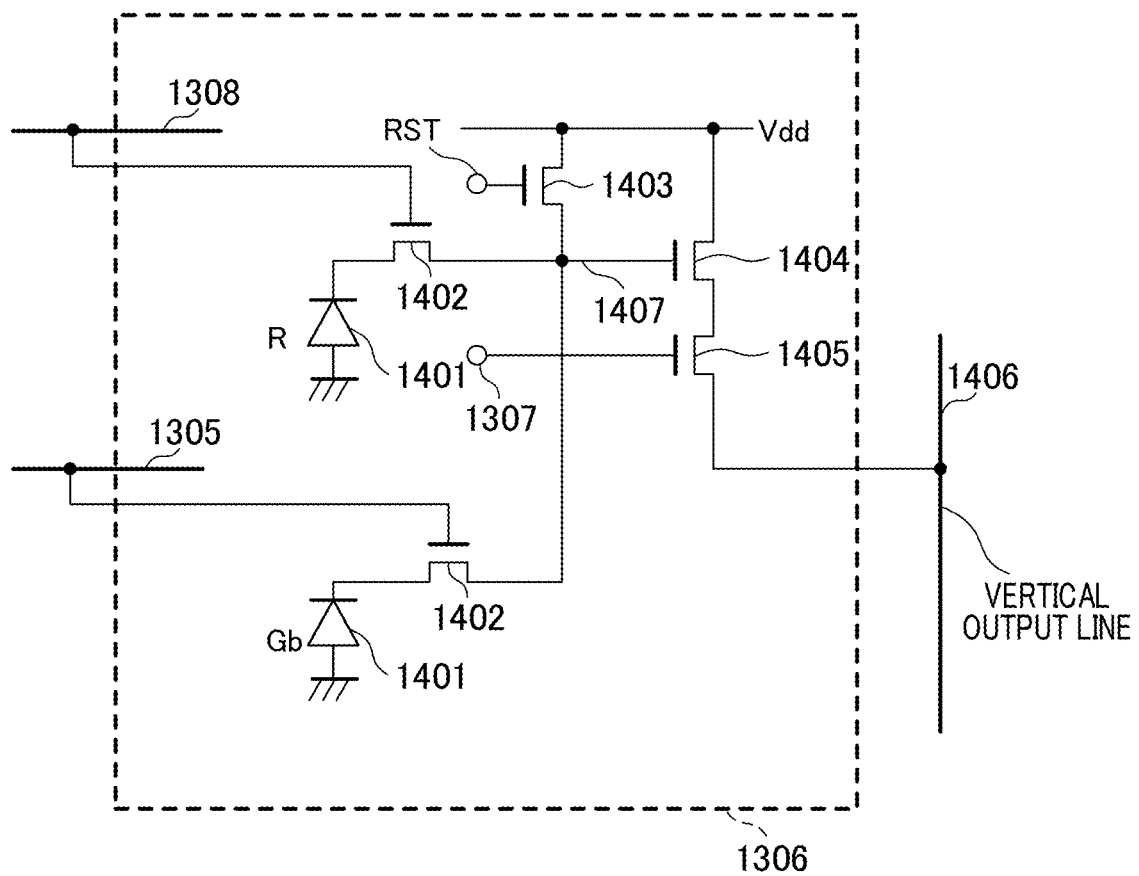
FIG. 8 is a schematic block diagram illustrating a pair of pixels included in the pixel unit 113 of a third embodiment.
Figure 9:
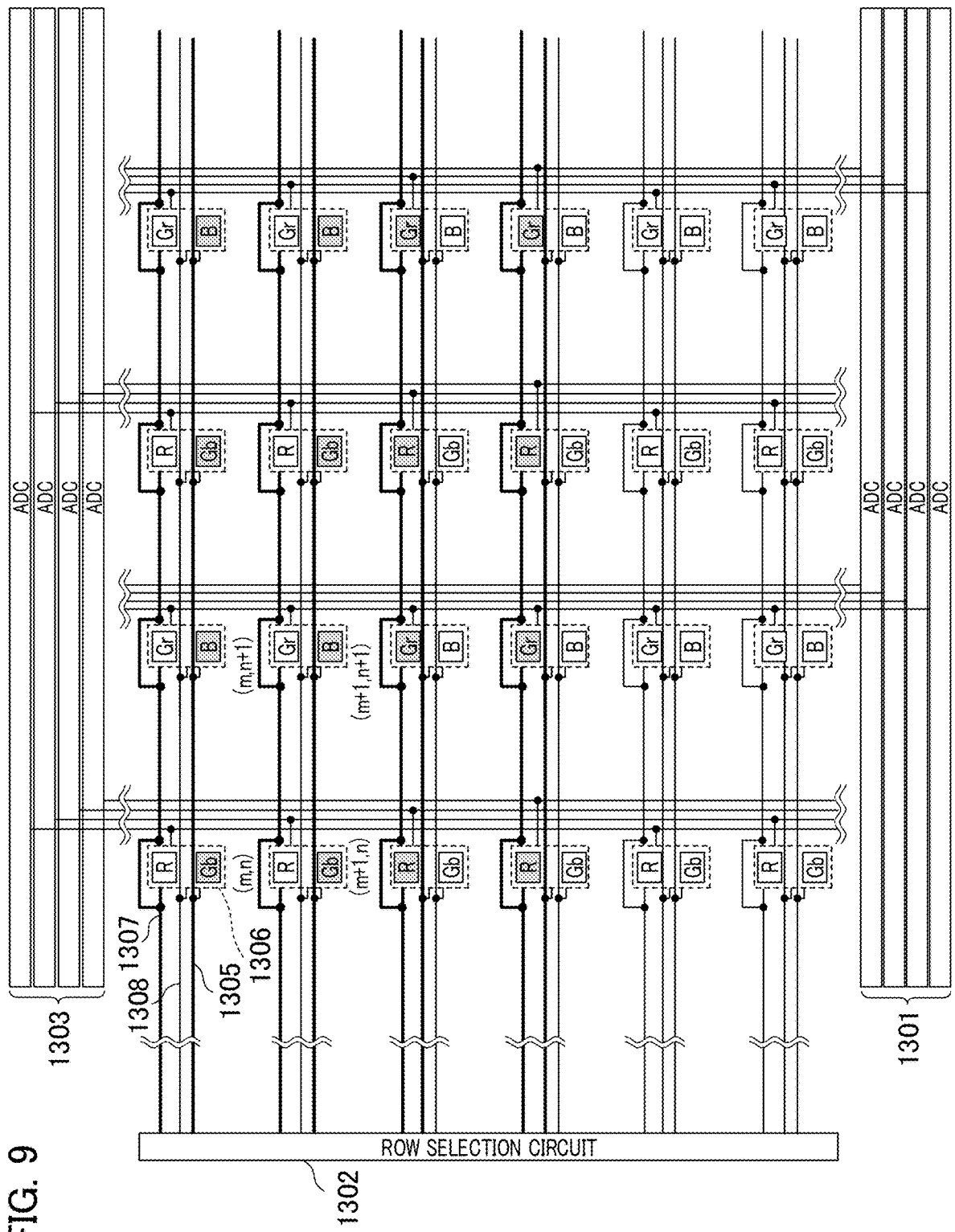
FIG. 9 is a schematic block diagram illustrating a pixel arrangement of the pixel unit 113 of the third embodiment.

Next, FIG. 8 shows a structure of each pixel pair of the pixel unit 113 according to the third embodiment. FIG. 9 shows a pixel arrangement according to the third embodiment.

In FIG. 8, 1401 denotes a photodiode (hereinafter PD) for photoconverting light received from an object into a corresponding amount of charges. A pixel pair 1306 includes a pixel having a (R) PD 1401 that receives light passing through a Red filter and a (Gb) PD 1401 that receives light passing through a Gb (Green) filter. An anode of each PD1401 is grounded and a cathode of each PD 1401 is connected to a common gate of an amplifying transistor 1404 via a transfer transistor 1402.

A node connected to the gate of the amplifying transistor 1404 constitutes a floating diffusion region (hereinafter a FD region) 1407. In this third embodiment, an R pixel and a Gb pixel share the FD region 1407. Transistors 1402 to 1405 are, for example, N channel MOS transistors.

A drain of a reset transistor 1403 is connected to a pixel power Vdd, and a source of the reset transistor 1403 is connected to the FD region 1407. The reset transistor 1403 is turned on by supplying a reset pulse RST to the gate thereof via a reset line so that the FD region 1407 is reset.

After resetting the FD region 1407, a transfer pulse is supplied to the transfer transistor 1402, which is connected to (R) PD 1401, via the first gate control line 1308 (also refer to FIG. 9), so that the transfer transistor 1402 is turned on and the charge photoconverted by the (R) PD 1401 is transferred to the FD region 1407.

A drain of a selection transistor 1405 is connected to, for example, a source of the amplifying transistor 1404, and a source of the selection transistor 1405 is connected to a vertical output line 1406. The selection transistor 1405 is turned on by supplying a common selection pulse to both pixels of the pixel pair via a row selection line 1307 (See FIG. 9).

Consequently, the charge photoconverted in the (R) PD 1401 is transferred to the FD region 1407, amplified by the amplifying transistor 1404, transferred to the vertical output line 1406 by turning on the selection transistor 1405, and then transferred to the ADC 1303 or the ADC 1301.

As shown in FIG. 9, the pixel unit 113 has a lot of pixels arranged two-dimensionally. And as shown in FIG. 8, the reset transistor 1403, the FD region 1407, the amplifying transistor 1404, and the selection transistor 1405 are shared by the pair of pixels in rows next to each other in the column direction.

In this connection, in FIG. 9, (m, n) denotes a pixel pair 1306 of a row number m and a column number n.

A first gate control line 1308, a second gate selection line 1305, and a row selection line 1307 are wired to each row of pixel pair 1306 from a row selection circuit 1302.

In a similar way explained referring to FIG. 3, by supplying respective voltages to the row selection line 1307, the first gate control line 1308, and the second gate selection line 1305 by the row selection circuit 1302, an arbitrary pixel row in the pixel arrangement can be designated.

In contrast to FIG. 3, as four rows are simultaneously read out in FIG. 9, the first ADC 1303 and the second ADC 1301 respectively perform A/D conversion for four rows. Additionally, pixel signals are alternately supplied to the first ADC 1303 and the second ADC 1301 column by column. More specifically, odd column pixels are read out to be supplied to the first ADC 1303 and even pixels are read out to be supplied to the second ADC 1301.

Fourth Embodiment

Figure 10:
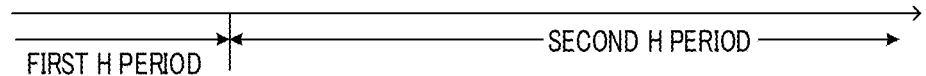
FIG. 10 is a timing chart illustrating a rearrangement method according to a fourth embodiment.
Figure 10:
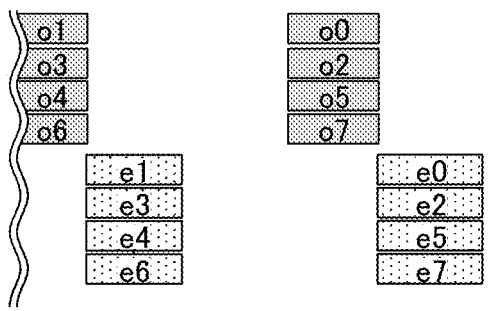
Figure 10:
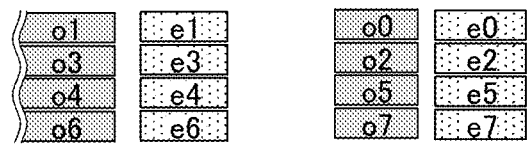
Figure 10:
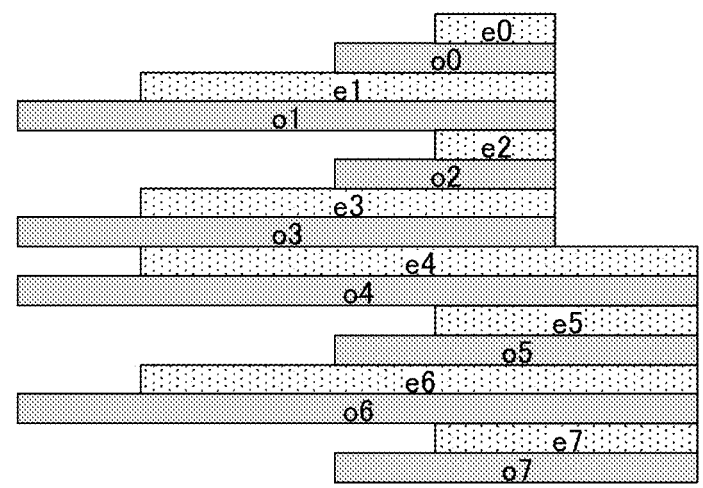

Next, referring to FIG. 10, a rearrangement method according to the fourth embodiment is explained, in which using the image sensor shown in FIG. 8 and FIG. 9, the second rearrangement circuit 121, and the second memory unit 122 are used without using the first rearrangement circuit 111 and the first memory unit 112.

In FIG. 10, "o" denotes pixels of odd columns (odd pixels), "e" denotes pixels of even columns (even pixels). For example, "o1" denotes pixel signals of a first line of odd columns, that is, pixel signals of the 1st column, 3rd column, 5th column, 7th column, and so on belonging to a 1st row.

Additionally, as mentioned before, odd column pixels are read out to be supplied to the first ADC 1303 and even pixels are read out to be supplied to the second ADC 1301, and respectively A/D converted. Therefore, as shown in FIG. 10, a group of odd column signals and a group of even column signals are respectively read out at different timings. In addition, a sequence of reading out rows has a particular feature. For example, in FIG. 10, in a first H period, the 1, 3, 4 and 6th row signals of odd columns and even columns are read out, and in the second H period, the 0, 2, 5 and 7th row signals of odd columns and even columns are read out.

In this embodiment, as read-out timings of pixels are shuffled in row and column directions compared to a physical pixel arrangement of the pixel unit 113, the rearrangement circuits rearrange read-out signals so that original pixel arrangement is restored.

That is, first, o1, o3, o4 and o6 row signals are stored in the second memory unit, then e1, e3, e4 and e6 row signals are stored in the second memory unit.

Thereafter, o0, o2, o5 and o7 row signals are stored in the second memory unit, and then e0, e2, e5 and e7 row signals are stored in the second memory unit, so that they are rearranged to restore the original pixel arrangement order.

In FIG. 10, as the information processing unit 120 performs the rearrangement process regarding row and column directions, the rearrangement process becomes complicated and the second memory unit 122 needs to store pixel signals of eight rows at the same time.

Fifth Embodiment

Figure 11:
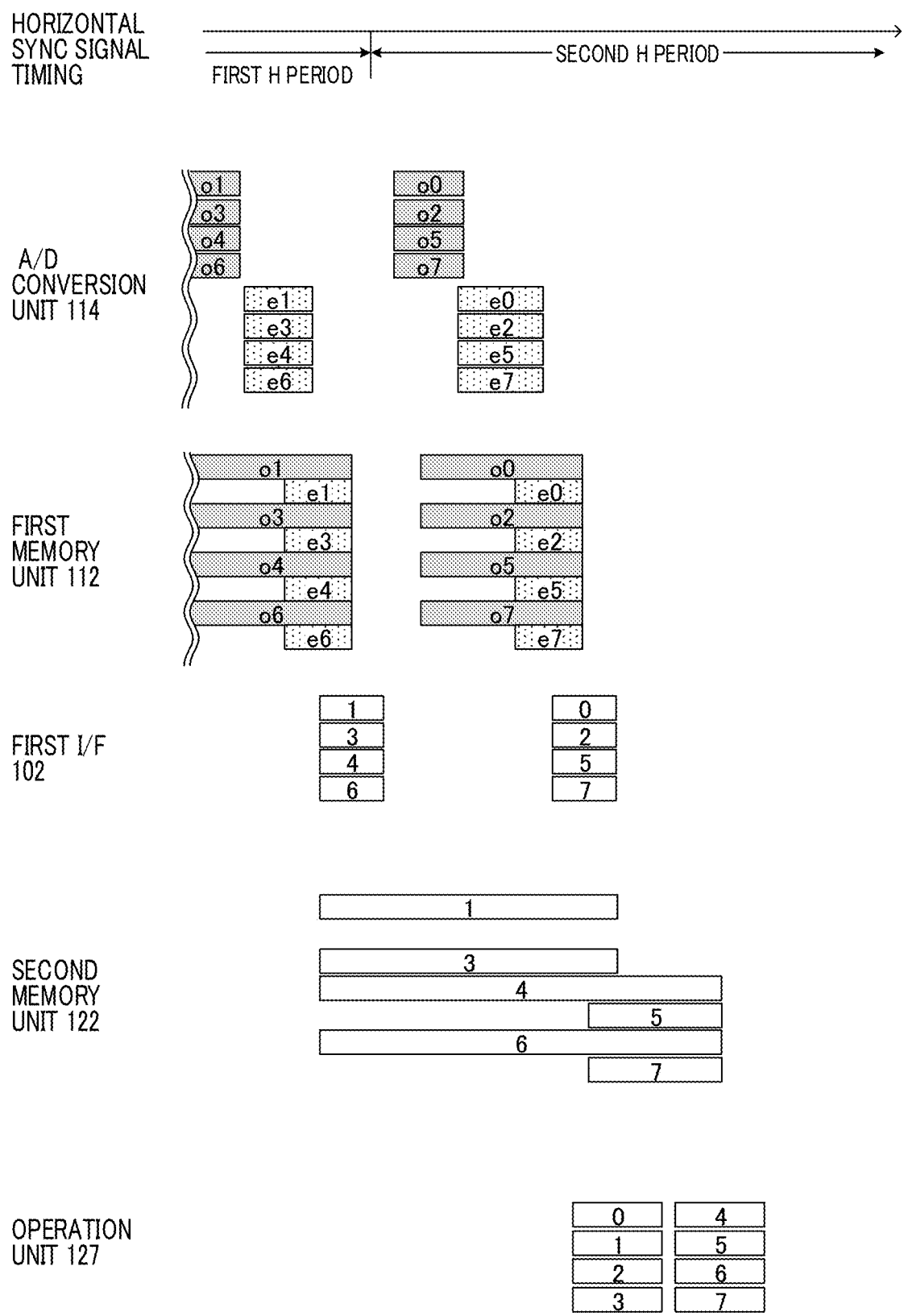
FIG. 11 is a timing chart illustrating a rearrangement method according to a fifth embodiment.

Next, referring to FIG. 11, a rearrangement method according to the fifth embodiment is explained wherein the image sensor and the information processing unit 120 share the rearrangement process. In the fifth embodiment, in contrast to FIG. 10, after the first memory unit 112 and the first rearrangement circuit 111 perform the rearrangement process for restoring pixel arrangement in a column direction, all the pixel signals in row direction are transferred to the information processing unit 120. Next, the second memory unit 122 and the second rearrangement circuit 121 perform the rearrangement process for restoring original row orders.

Specifically, in a first H period, o1, o3, o4 and o6 row signals are read out to be stored in the first memory unit 112, and then e1, e3, e4 and e6 row signals are read out to be also stored in the first memory unit in the same first H period. Thereafter, the e1, e3, e4 and e6 row signals are alternately read out from the first memory unit with the o1, o3, o4 and o6 row signals so that all the pixel signals of each of 1, 3, 4 and 6 rows are rearranged to restore an original odd and even order of pixel arrangement in row direction. Then, all the pixel signals of each of 1, 3, 4 and 6 rows are transferred to the information processing unit 120 via the first I/F 102 and stored in the second memory unit.

After that, in the second H period, o0, o2, o5 and o7 row signals are read out to be stored in the first memory unit 112, and then e0, e2, e5 and e7 row signals are read out to be also stored in the first memory unit in the same second H period. Thereafter, all the pixel signals of each of the 0, 2, 5 and 7th rows are read out from the first memory unit to be rearranged to restore an original odd and even order of pixel arrangement in row direction, then transferred to the information processing unit 120 via the first I/F 102.

Subsequently, all the pixel signals of each of the 0, 2, 5 and 7th rows are alternately rearranged with all the pixel signals of each of the 1, 3, 4 and 6th rows stored in the second memory unit by using the second rearrangement circuit and the second memory unit so as to restore the original pixel arrangement.

Consequently, the image sensor 110 and the information processing unit 120 share the rearrangement process so that the workload for the rearrangement process in each of the rearrangement circuits is reduced and the area of the first memory unit 112 and the second memory unit 122 are properly allotted.

Sixth Embodiment

Figure 12:
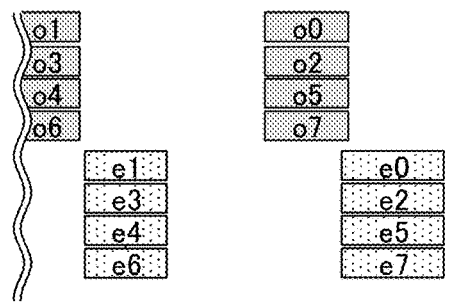
FIG. 12 is a timing chart illustrating a rearrangement method according to a sixth embodiment.
Figure 12:
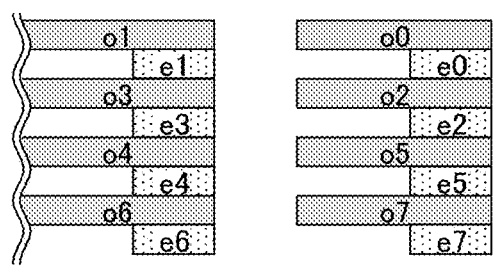
Figure 12:
Figure 12:
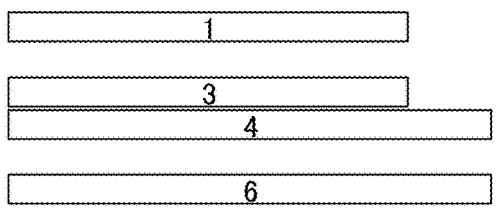
Figure 12:
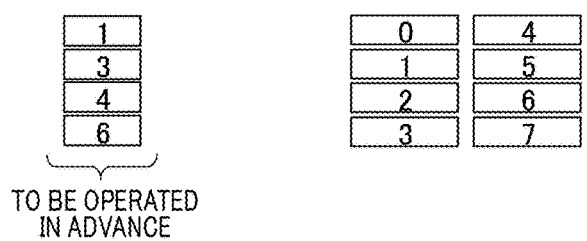

As disclosed above, by sharing the rearrangement process by the first rearrangement circuit 111 and the second rearrangement circuit 121, the sizes of the circuits are properly allotted and optimized, and further merit is available according to the sixth embodiment, which is explained here by referring to FIG. 12.

FIG. 12 differs from FIG. 11 in that the information processing unit 120 not only stores pixel signals of the 1, 3, 4 and 6th row signals received via the first I/F 102 in the second memory unit 122, but transfers them in parallel to the operation unit 127 in the first H period.

In the method shown in FIG. 10 and FIG. 11, after all the 1st to 8th row signals are rearranged by using the second memory unit 122, the operation unit 127 received the rearranged signals.

However, in FIG. 12, after the rearrangement process, for example, in column order is performed, by transferring rearranged data via the first I/F 102 to the operation unit 127 in parallel with storing the data in the second memory, a variety of operation, such as auto-focusing, image recognition, operations for compression/encoding and so on, can be performed earlier.

To be more specific, for example, when performing operations for auto-focusing, image recognition, or compression/encoding, it is preferable that all pixel data in a row direction has been already rearranged for restoring. In other words, if odd pixel signals and even pixel signals are already rearranged to restore the original order by the first rearrangement circuit 111 and the first memory unit 112, the restored signals can be used for performing such operations disclosed above while the second rearrangement circuit 121 is rearranging pixel signals to restore the original row order. Therefore, the waiting time for finishing the above operations can be reduced.

In short, according to this embodiment, the first rearrangement circuit rearranges pixel signals of predetermined rows or columns necessary for advancing processing in the information processing unit, which is external to the image sensor, and in parallel with the rearrangement process by the second rearrangement circuit, other signal processing can be performed earlier. Here, other signal processing can include displaying enlarged images for framing in photography. In that case, the images to be enlarged should be rearranged in the first rearrangement circuit on a priority basis so that a delay in displaying enlarged images can be reduced.

Seventh Embodiment

Figure 13:
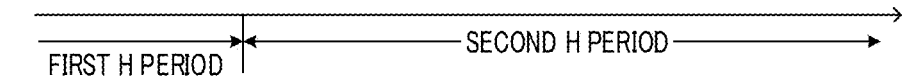
FIG. 13 is a timing chart illustrating a rearrangement method according to a seventh embodiment.
Figure 13:
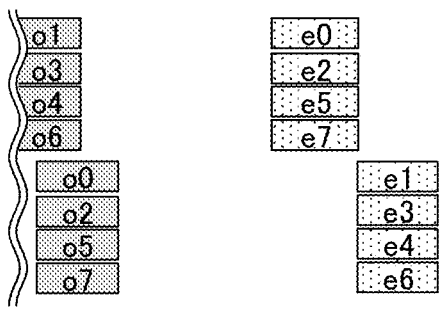
Figure 13:
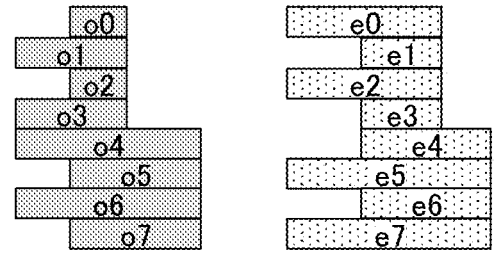
Figure 13:
Figure 13:
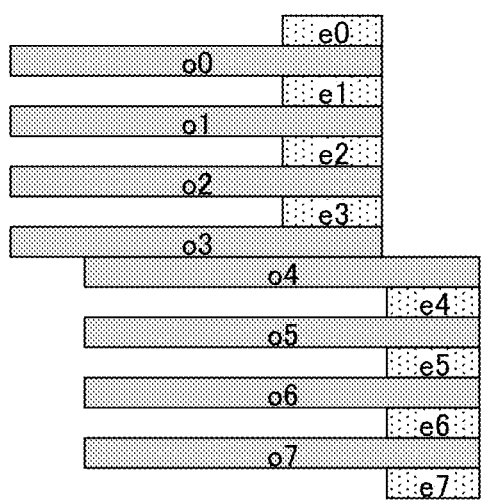
Figure 13:
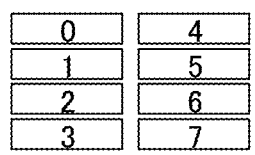

Next, referring to FIG. 13, a rearrangement method according to the seventh embodiment is explained, wherein pixel signals are read out using the pixel structure shown in FIG. 8 and FIG. 9, but the reading sequence is different from other embodiments. To be more specific, in a first H period synchronizing with horizontal sync signal, o1, o3, o4 and o6 row signals are read out to be stored in the first memory unit 112, o0, o2, o5 and o7 row signals are read out to be stored in the first memory unit 112, and then row order is restored by the first rearrangement circuit 111.

Additionally, in the second H period, e0, e2, e5 and e7 row signals are read out to be also stored in the first memory unit, and then e1, e3, e4 and e6 row signals are read out to be also stored in the first memory unit.

Thereafter, row orders for even column pixel signals are restored by the first rearrangement circuit 111. That is, the first rearrangement circuit 111 and the first memory unit 112 restore the row orders of original pixel arrangement of the pixel unit 113.

Subsequently, the second memory unit 122 and the second rearrangement circuit 121 rearrange pixel signals to restore column orders of original pixel arrangement of the pixel unit 113.

According to the seventh embodiment, similar to other embodiments, the workload for each rearrangement circuit can be reduced, and areas for each memory unit can be properly allotted.

Eighth Embodiment

Figure 14:
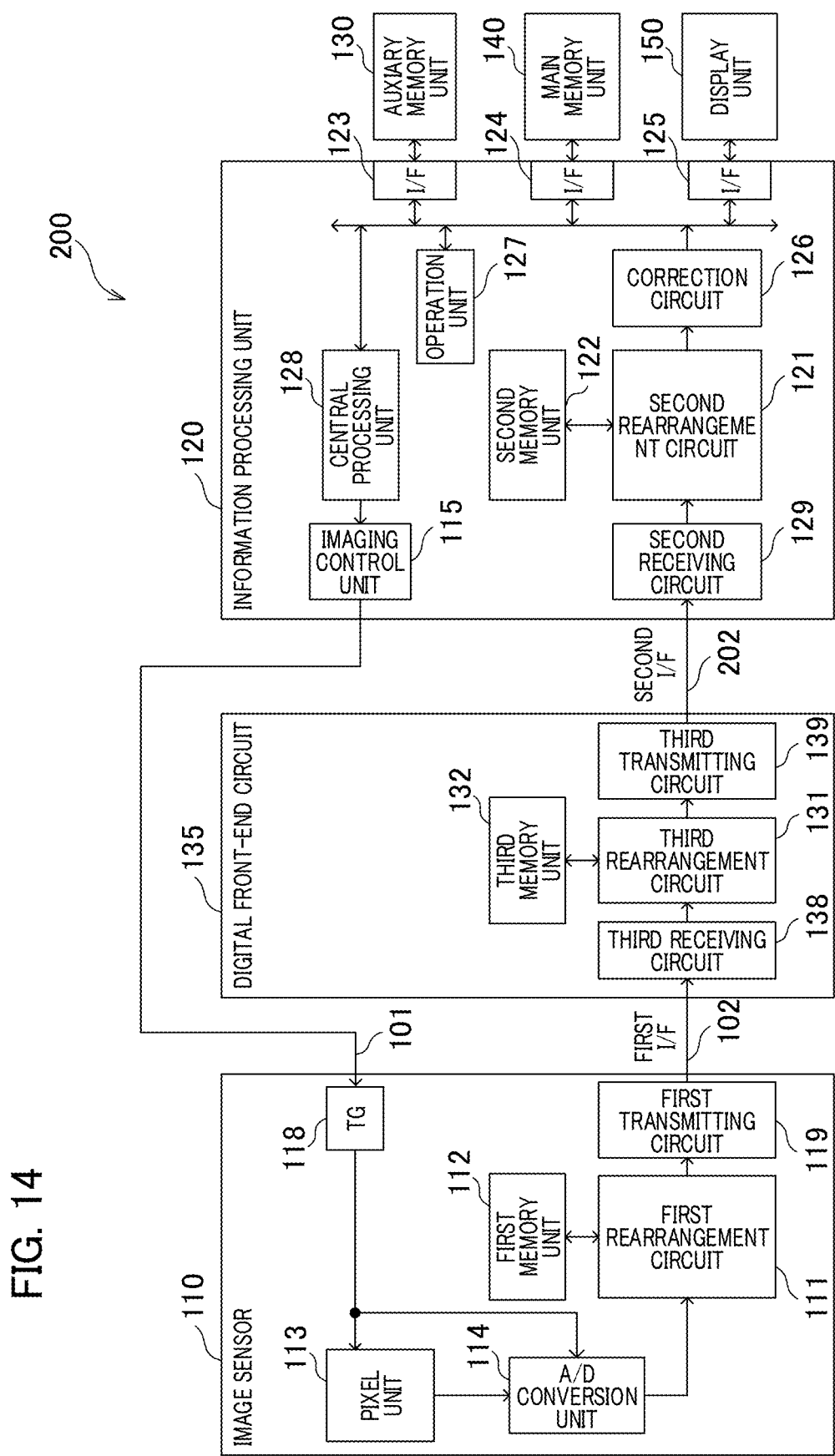
FIG. 14 is a schematic block diagram of an imaging apparatus 200 according to an eighth embodiment.

Next, referring to FIG. 14, which is a block diagram of an imaging apparatus 200, the eighth embodiment is explained. A difference with respect to the imaging apparatus 100 is that a digital front-end circuit 135 is additionally installed between the image sensor 110 and the information processing unit 120.

First, the digital front-end circuit 135 is explained. 131 denotes a third rearrangement circuit for rearranging digital data received by a third receiving circuit 138. 132 denotes a third memory unit for temporarily storing data for realizing a part of the rearrangement process by the third rearrangement circuit 131.

139 denotes a third transmitting circuit for converting digital data rearranged by the third rearrangement circuit 131 for transmission to the information processing unit 120 via a second I/F 202.

The second I/F 202 is an interface for transferring signals converted by the third transmitting circuit 139 to the information processing unit 120.

According to the structure of FIG. 14, the rearrangement process is allotted to the first rearrangement circuit 111, the second rearrangement circuit 121, and the third rearrangement circuit 131. That is, compared to the imaging apparatus 100, the workload for the rearrangement process is more divided, and this embodiment has further merit when the digital front-end circuit 135 is formed with the image sensor in multi-layer arrangement.

Other Embodiments

The present invention can be realized in processes in which a program that executes one or more functions of the above embodiment is supplied to a system or a device through a network or a storage medium, and one or more processors in a computer of the system or the device read and execute the program. In addition, the present invention can be realized by a circuit (for example, an ASIC) that implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. This application claims the benefit of Japanese Patent Application No. 2018-142398 filed on Jul. 30, 2018, which is hereby incorporated by reference herein in its entirety.

What is claimed is:

1. An imaging apparatus comprising:
   a) an image sensor including a pixel unit having a plurality of pixels arranged in a predetermined two-dimensional arrangement, a first memory for storing at least a part of image signals output from the pixel unit, and a first rearrangement circuit for rearranging rows or columns of image signals using image signals stored in the first memory; and
   b) an information processing unit having a second memory for receiving at least a part of image signals rearranged by the first rearrangement circuit of the image sensor, a second rearrangement circuit for rearranging rows or columns of image signals using the image signals stored in the second memory, and a control circuit for simultaneously reading out a plurality of rows of image signals from the pixel unit, making the first rearrangement circuit rearrange image signals and then making the second rearrangement circuit rearrange image signals rearranged by the first rearrangement circuit to restore a pixel order of the image signals so as to correspond to the predetermined two-dimensional arrangement.

2. The imaging apparatus according to claim 1, wherein the image sensor is configured as an IC chip.

3. The imaging apparatus according to claim 2, wherein the image sensor includes a multi-layer type image sensor, and wherein the pixel unit and the first rearrangement circuit are arranged in respectively different layers.

4. The imaging apparatus according to claim 2, wherein the image sensor includes a multi-layer type image sensor, and
wherein the first rearrangement circuit and the first memory are arranged in respectively different layers.

5. The imaging apparatus according to claim 2, wherein the information processing unit is constructed as an IC chip different from the IC chip constructed by the image sensor.

6. The imaging apparatus according to claim 1, further comprising a digital front-end circuit having a third arrangement circuit and a third memory,
wherein the digital front-end circuit is connected between the image sensor and the information processing unit.

7. The imaging apparatus according to claim 1, wherein the first rearrangement circuit rearranges pixel signals in a column direction, and the second rearrangement circuit rearranges pixel signals in a row direction.

8. The imaging apparatus according to claim 1, wherein the first rearrangement circuit rearranges pixel signals in a row direction, and the second rearrangement circuit rearranges pixel signals in a column direction.

9. The imaging apparatus according to claim 1, wherein the first rearrangement circuit rearranges pixel signals in a row direction to form a first image signal, and while the second rearrangement circuit rearranges the first image signal in a column direction, the first image signal is processed for at least one of an autofocus operation, an image recognition operation, and a compression/encoding operation.

10. The imaging apparatus according to claim 1, wherein a predetermined circuit within the pixel is shared by a plurality of pixels arranged next to each other in the pixel unit.

11. The imaging apparatus according to claim 10, wherein the predetermined circuit includes a floating diffusion region.

12. An imaging apparatus comprising:
an image sensor including a pixel unit having a plurality of pixels arranged in a predetermined two-dimensional arrangement, a first memory for storing at least a part of image signals output from the pixel unit, a first rearrangement circuit for rearranging rows or columns of image signals using image signals stored in the first memory,
wherein a predetermined circuit within the pixel is shared by a plurality of pixels arranged next to each other, and
wherein a plurality of rows of image signals of the pixel unit are simultaneously read out and stored in the first memory, and the first rearrangement circuit rearranges the image signals from the first memory to restore at least part of a pixel order of image signals so as to correspond to the predetermined two-dimensional arrangement.

13. The imaging apparatus according to claim 12, further comprising a second memory and a second rearrangement circuit,
wherein the second memory and the second rearrangement circuit are arranged in a second semiconductor substrate other than a first semiconductor substrate where the pixel unit, the first memory, and the first rearrangement circuit are arranged.

14. The imaging apparatus according to claim 13, wherein the first semiconductor substrate is included in an image sensor IC chip and the second semiconductor substrate is included in a process IC chip.

15. The imaging apparatus according to claim 14, wherein the first memory and the first rearrangement circuit included in the image sensor IC chip perform a first rearrangement process for image signals output from the pixel unit and the second memory and the second rearrangement circuit included in the process IC chip perform a second rearrangement process for image signals subjected to the first rearrangement process, and
wherein the second rearrangement process is different from the first rearrangement process.

16. The imaging apparatus according to claim 12, wherein the predetermined circuit includes a floating diffusion region.

* * * * *